US008436430B2

(12) United States Patent
Yu et al.

(10) Patent No.: US 8,436,430 B2
(45) Date of Patent: May 7, 2013

(54) DIODES WITH EMBEDDED DUMMY GATE ELECTRODES

(75) Inventors: Ming-Hsin Yu, Taichung (TW); Kvei-Feng Yen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 76 days.

(21) Appl. No.: 13/082,871

(22) Filed: Apr. 8, 2011

(65) Prior Publication Data

US 2012/0256292 A1 Oct. 11, 2012

(51) Int. Cl.
*H01L 29/772* (2006.01)

(52) U.S. Cl.
USPC .................................. 257/409; 257/E29.242

(58) Field of Classification Search .................. 257/510, 257/503, 360, 369, 409, E29.242
See application file for complete search history.

(56) References Cited

U.S. PATENT DOCUMENTS 7,420,255 B2 * 9/2008 Shimizu ........................ 257/409
7,994,577 B2 * 8/2011 Shih et al. ..................... 257/355
8,097,925 B2 * 1/2012 Jensen et al. .................. 257/409
2002/0079556 A1 * 6/2002 Ishikura et al. ............... 257/607
2009/0020826 A1 * 1/2009 Huang et al. .................. 257/371
2009/0294865 A1 * 12/2009 Tang et al. .................... 257/369
2010/0013016 A1 * 1/2010 Shih et al. ..................... 257/360
2011/0053326 A1 * 3/2011 Gao et al. ...................... 438/270
2011/0233717 A1 * 9/2011 Jensen et al. .................. 257/503
2011/0254091 A1 * 10/2011 Shih et al. ..................... 257/350
2012/0049278 A1 * 3/2012 Cha et al. ...................... 257/343
2012/0083094 A1 * 4/2012 Jensen et al. .................. 438/424

* cited by examiner

*Primary Examiner* — Nathan Ha
(74) *Attorney, Agent, or Firm* — Slater & Matsil, L.L.P.

(57) ABSTRACT

A circuit structure includes a first isolation region, and a first dummy gate electrode over and vertically overlapping the first isolation region. First pickup regions of a diode are formed on opposite sides of the first isolation region, wherein sidewalls of the first pickup regions contact opposite sidewalls of the first isolation region. Second pickup regions of the diode are formed on opposite sides of a combined region of the first pickup regions and the first isolation region, wherein the first and the second pickup regions are of opposite conductive types. A well region is under the first and the second pickup regions and the first isolation region, wherein the well region is of a same conductivity type as the second pickup regions.

23 Claims, 10 Drawing Sheets

DIODES WITH EMBEDDED DUMMY GATE ELECTRODES

BACKGROUND

In input/output (IO) circuits, large diodes occupying great chip areas are needed for electro-static discharge (ESD) protection. For the ESD diodes, the ability to discharge ESD currents is partially determined by the sizes of the diodes. Accordingly, the diodes are designed as large as possible. Furthermore, required by design rules, the sizes of the anodes and cathodes of the diodes affect the widths of the metal lines directly over the respective anodes and cathodes. Accordingly, to gain good electro-migration performance of the metal lines directly over the diodes for robust ESD performance, the diodes are designed to have wide anode pickup regions and/or wide cathode pickup regions, rather than comprising many narrow anode pickup regions and/or narrow cathode pickup regions.

Since the ESD diodes are formed on the same chip/wafer as transistors, which comprise gate electrodes, ESD diodes need to have dummy gate electrodes formed thereon, so that the pattern density of the gate electrodes is substantially uniform across the entire wafer. Otherwise, the pattern loading effect may cause the degradation of the circuits. Design rules require that in any limited area (for example, 20 μm×20 μm or 10 μm×10 μm), the pattern density of dummy gate electrodes is greater than a specified value such as 10 percent. Such requirement is difficult to meet when wide anode pickup regions and/or wide cathode pickup regions are designed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A diode is provided in accordance with an embodiment. The variations and the operation of the embodiment are discussed. Throughout the various views and illustrative embodiments, like reference numbers are used to designate like elements.

Figure 1A:
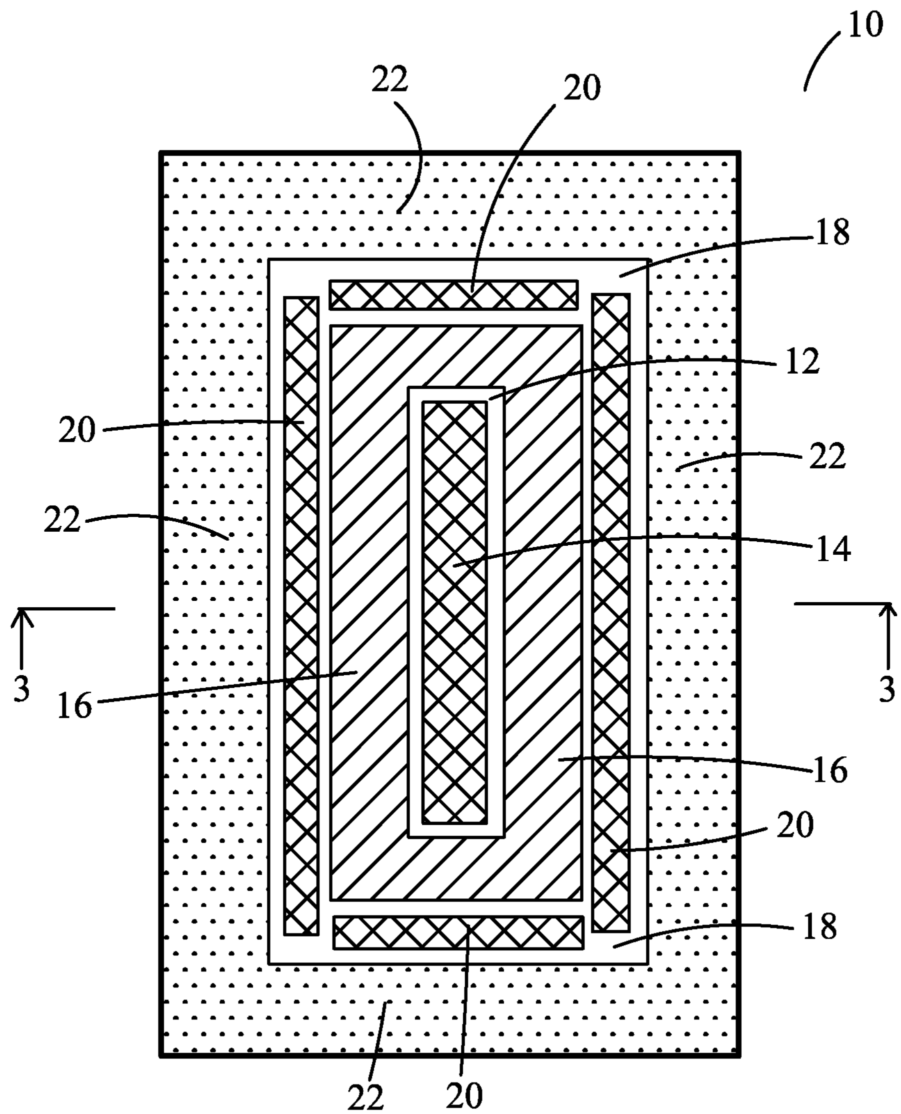
FIGS. 1A, 1B, and 2 are top views of diodes in accordance with various embodiments, wherein a dummy gate electrode is placed between portions of a same anode, and wherein the diodes are formed based on n-well regions.

FIG. 1A illustrates a top view of a portion of diode 10 in accordance with an embodiment. Diode 10 includes isolation region 12, which may be a shallow trench isolation (STI) region. Dummy gate electrode 14 is formed over, and vertically overlapping, STI region 12. Anode 16 encircles STI region 12 and dummy gate electrode 14. Anode 16 may be a heavily doped p-type (P+) region. Furthermore, STI region 18 encircles anode 16. STI region 18 may be further encircled by cathode pickup region 22, which may be a heavily doped n-type (N+) region. Throughout the description, the term "heavily doped" means an impurity concentration above about $10^{19}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments.

Dummy gate electrode(s) 20 are further formed over, and vertically overlapping, STI region 18. In an embodiment, dummy gate electrodes 20 include a plurality of discrete dummy gate electrodes separated from each other. Dummy gate electrodes 14 and 20 may be formed simultaneously with the formation of gate electrodes of transistors (not shown) in the same chip/wafer. Dummy gate electrodes 14 and 20 may be electrically floating, and may be left unmoved after the formation of contacts plugs and overlying metal lines (refer to FIG. 4). In an embodiment, dummy gate electrode(s) 14 and 20 are formed of polysilicon. In alternative embodiments, dummy gate electrode(s) 14 and 20 are formed of metals or metal alloys. STI regions 12 and 18 may be formed silicon oxide, silicon nitride, or other dielectric materials suitable for isolation purpose.

Figure 1B:
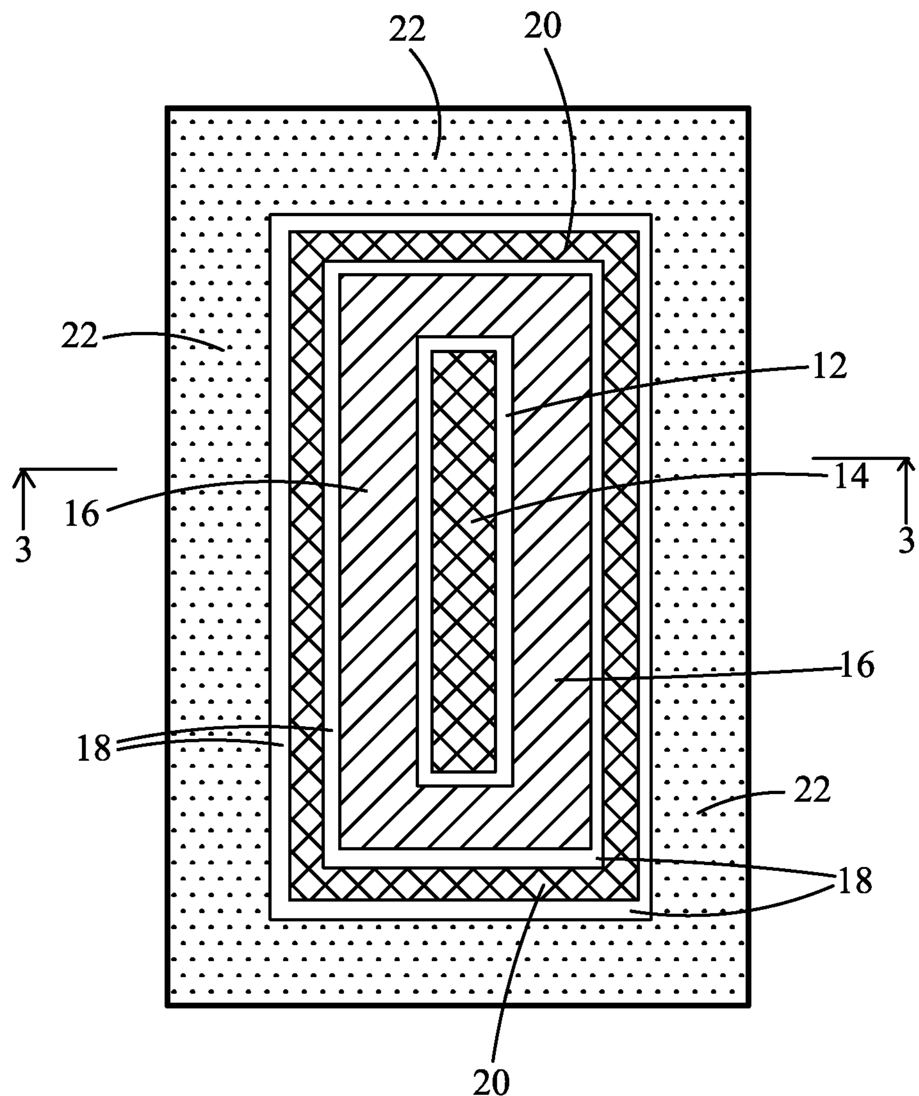

FIG. 1B illustrates a top view of a portion of diode 10 in accordance with various alternative embodiments. Unless specified otherwise, the reference numerals in these embodiments represent like elements in the embodiments illustrated in FIG. 1A. This embodiment is similar to the embodiment shown in FIG. 1A, except dummy gate electrode(s) 20 are interconnected to form a rectangle. The rectangle encircles (and over) anode 16 and dummy gate electrode 14.

Figure 2:
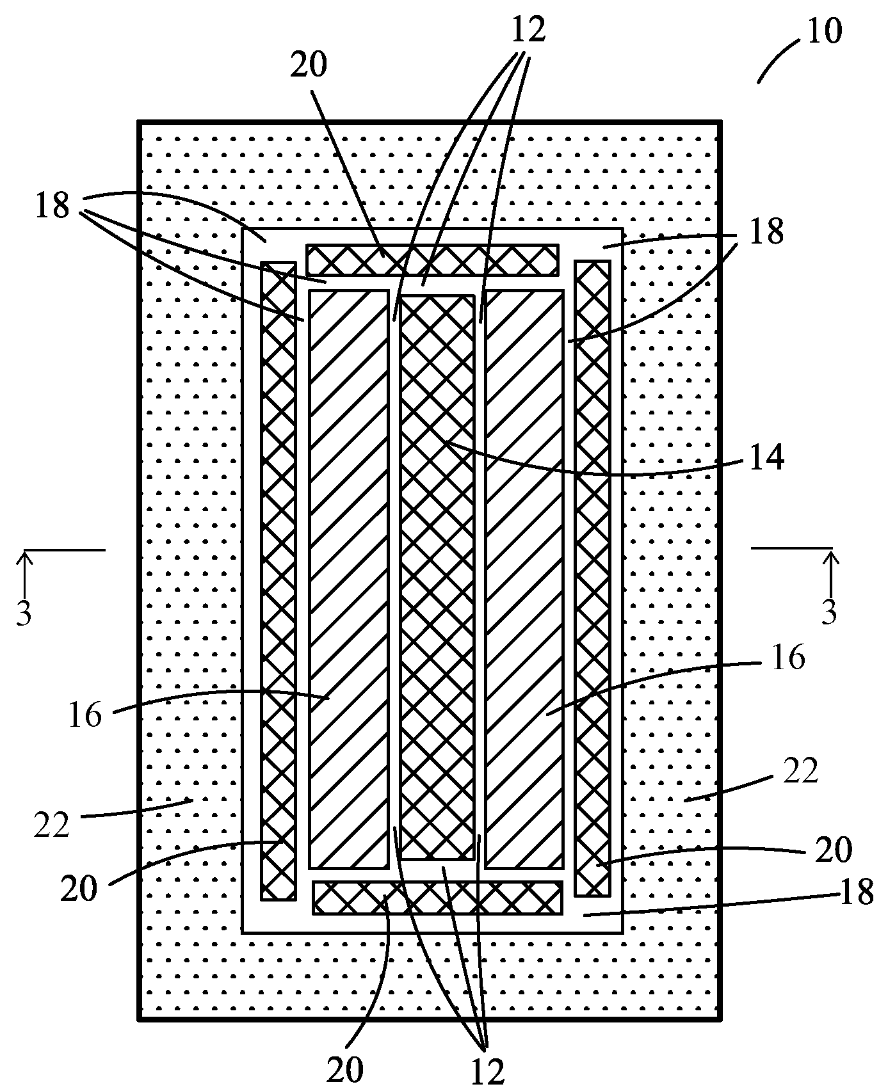

FIG. 2 illustrates an alternative embodiment, which is essentially the same as the embodiment shown in FIG. 1A, except anode 16 comprises two discrete portions separated from each other by STI region 12. Please note that although FIG. 2 illustrates that there are two STI regions 12, the two STI regions 12 actually belong to the same continuous STI region extending directly underlying dummy gate electrode 14. The two portions of anode 16 do not form a ring encircling STI region 12 and dummy gate electrode 14. The two portions of anode 16 are further located on opposite sides of STI region 12 and dummy gate electrode 14, and the sidewalls of the two portions of anode 16 contacts opposite sidewalls of STI region 12. STI regions 12 and 18 may form a continuous STI region.

Figure 3:
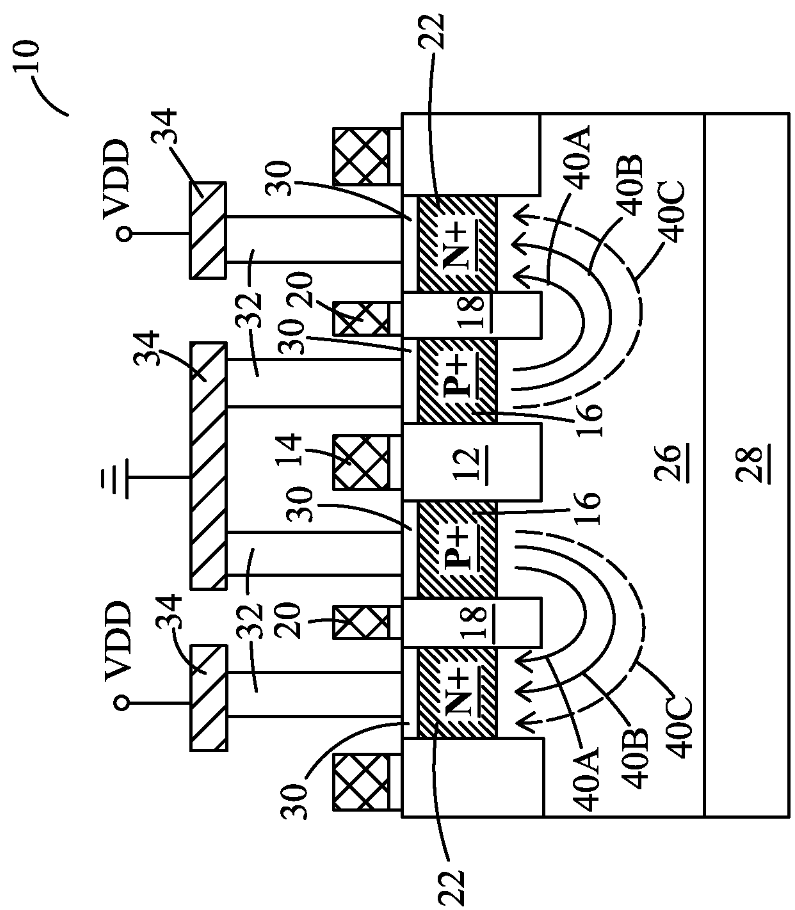
FIG. 3 is a cross-sectional view of the diodes shown in FIGS. 1A, 1B, and 2.

FIG. 3 illustrates a cross-sectional view of diode 10 as shown in FIGS. 1A, 1B, and 2, wherein the cross-sectional view is obtained from the plane crossing lines 3-3 in FIGS. 1 and 2. In the cross-sectional view, it is shown that n-well region 26 is formed underlying STI regions 12 and 18, anode 16, and cathode pickup region(s) 22. Furthermore, n-well region 26 is formed over, and may contact, p-type substrate 28. Anode 16, cathode pickup region(s) 22, and n-well region

26 may be formed through implantation by implanting appropriate impurities into p-type substrate 28. FIG. 3 also schematically illustrates silicide regions 30, contact plugs 32, and metal lines 34.

It is observed that the p-n junction of diode 10 is formed between anode 16 and n-well region 26. Accordingly, cathode pickup regions 22 are pickup regions of n-well region 26, and are also parts of the cathode. On the other hand, anode 16 acts as both the anode and the anode pickup region. In the cross-sectional view, anode 16 is illustrated as two anode regions on opposite sides of, and having sidewalls contacting the sidewalls of, STI region 12. During the operation of diode 10, anode 16 may be connected to the electrical ground, and cathode pickup regions 22 may be connected to a positive power supply node such as VDD.

Figure 4:
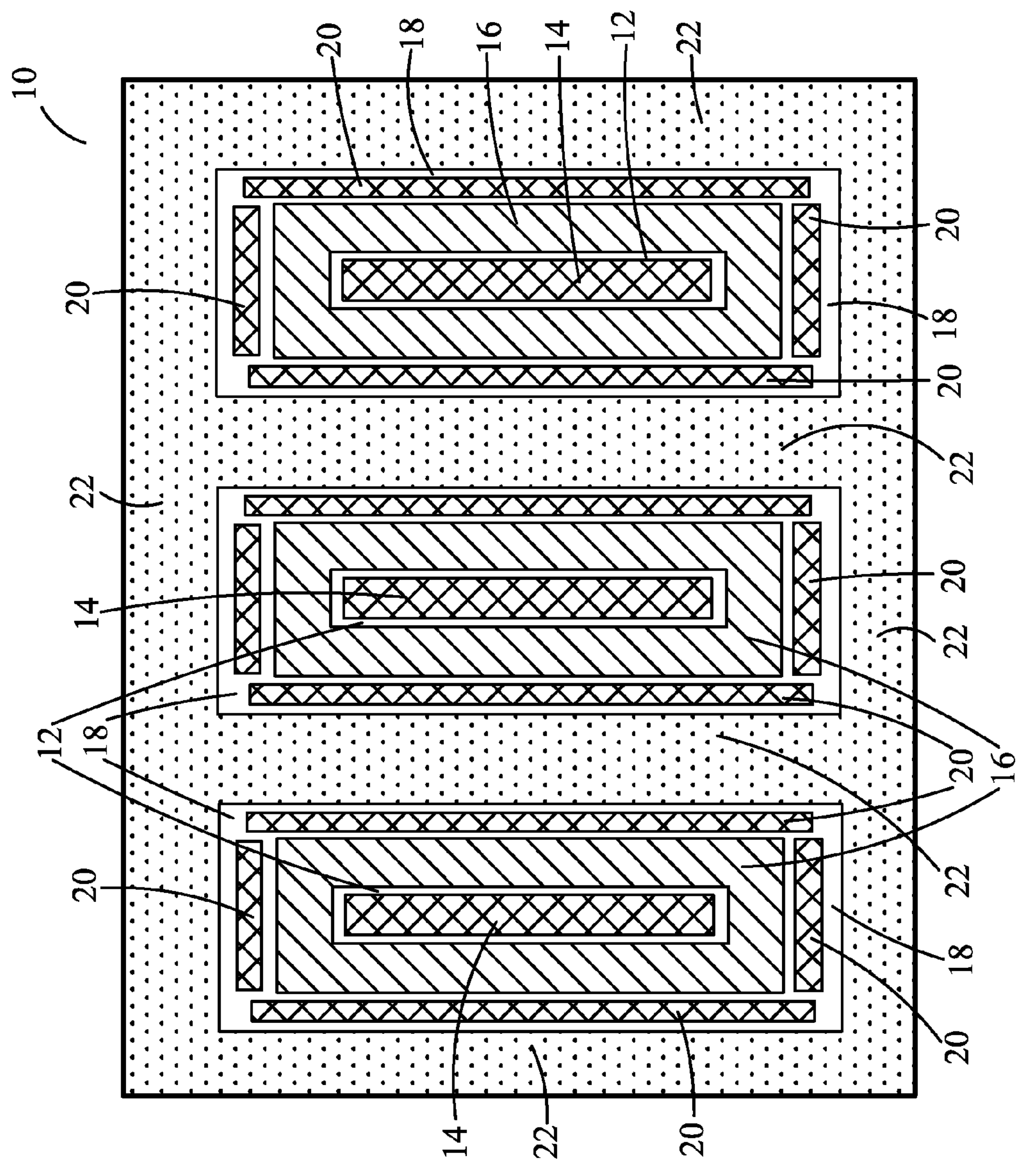
FIG. 4 is a top view of a diode comprising a plurality repeated patterns, with each of the repeated patterns comprising an anode and a dummy gate electrode between portions of the anode.

To increase the size of diode 10, the structure as shown in FIG. 1A, 1B, or FIG. 2 may be repeated, and the repeated portions are interconnected to form a single large diode. FIG. 4 illustrates an example formed by repeating the structure as in FIG. 1A. Cathode pickup region 22 forms a large region enclosing a plurality of STI regions 18 and a plurality of dummy gate electrodes 20. Each of STI regions 18 further encircles one or more anode 16. Furthermore, each anode 16 may encircle one or more STI region 12 and one or more dummy gate electrode 14 over the respective STI region 12. All anodes 16 may be electrically connected through contact plugs and metal lines (not shown in FIG. 4, please refer to FIG. 3) as a single anode.

Figure 5:
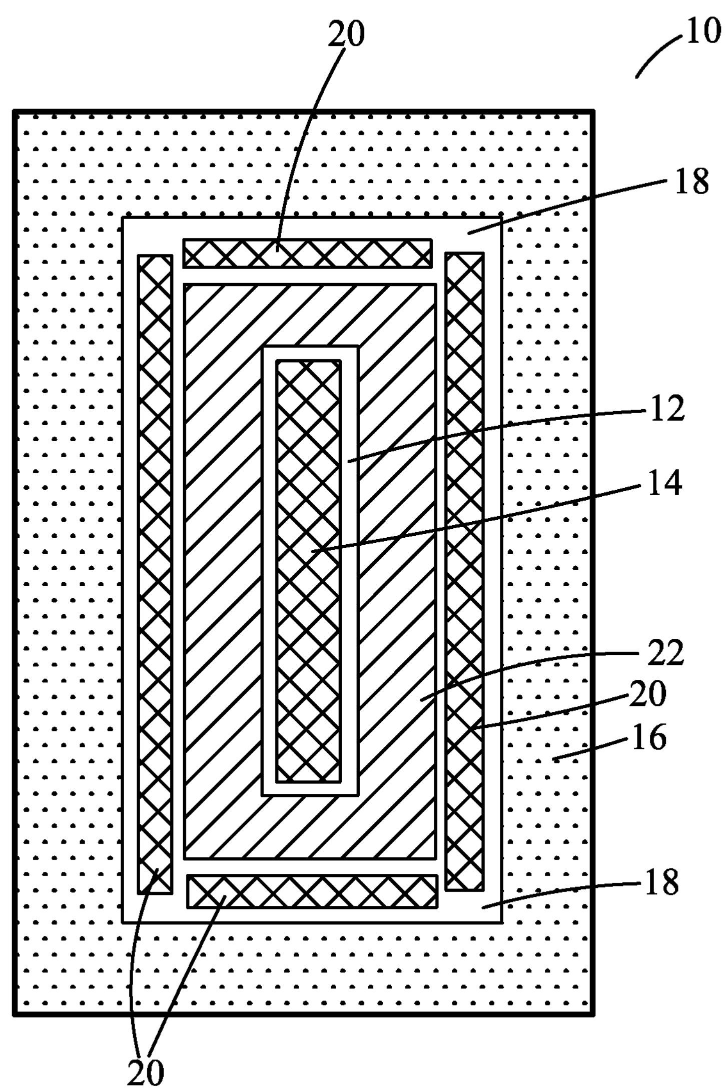
FIGS. 5 through 7 are top views and a cross-sectional view of a diode formed based on p-well regions.
Figure 6:
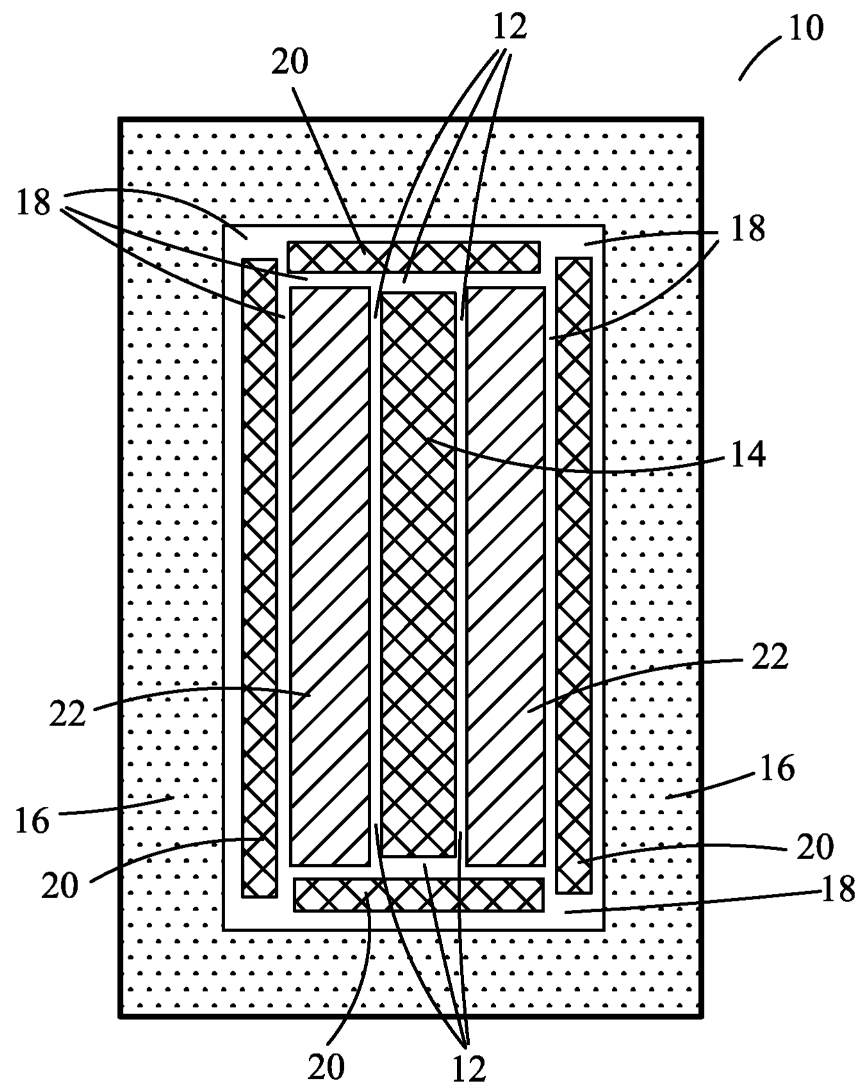
Figure 7:
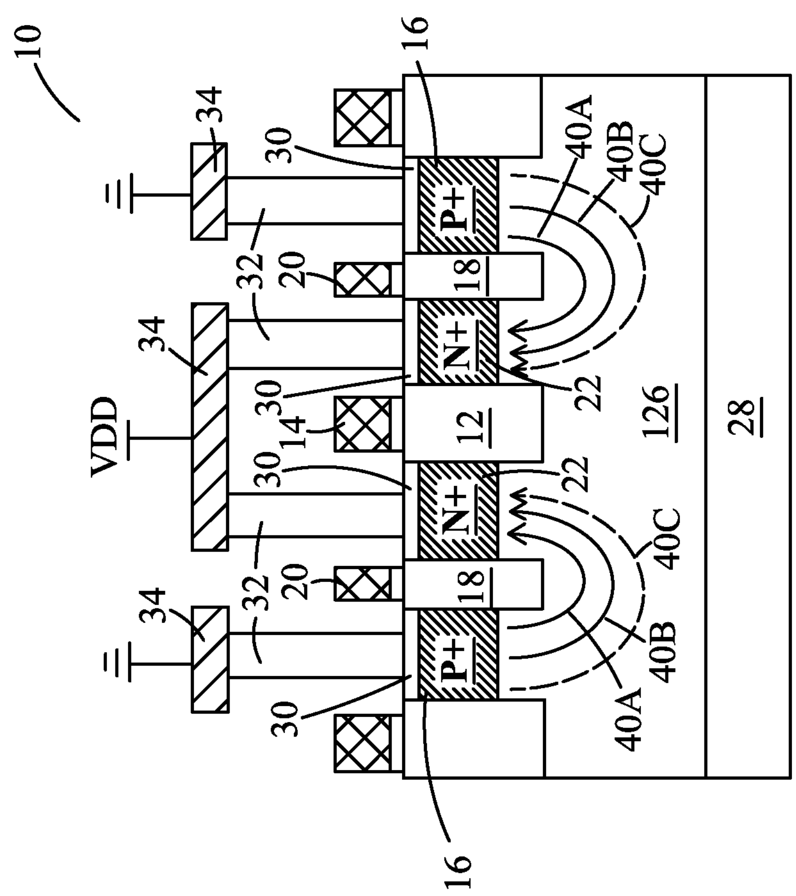

In above discussed embodiments, anode 16 and STI regions 12 and 18 are encircled by (or located between) cathode pickup region(s) 22. In alternative embodiments, the conductivity types of regions 16 and 22 in FIGS. 1 through 3 are inverted. The resulting structures are shown in FIGS. 5 through 7, wherein FIG. 7 is a cross-sectional view obtained from FIGS. 5 and 6. In FIG. 5, cathode 22 encircles STI region 12, on which dummy gate electrode 14 is located. STI region 18 further encircles cathode 22. In FIG. 6, cathode 22 includes two portions separated by STI region 12, and STI region 12 and dummy gate electrode 14 are between two discrete portions of cathode 22.

FIG. 7 illustrates that the p-n junction of diode 10 is between p-well region 126 and the overlying cathode 22. Cathode 22 acts as both the cathode and the cathode pickup region. On the other hand, anode pickup regions 16 are pickup regions of p-well region 126, and are also parts of the anode.

Figure 8:
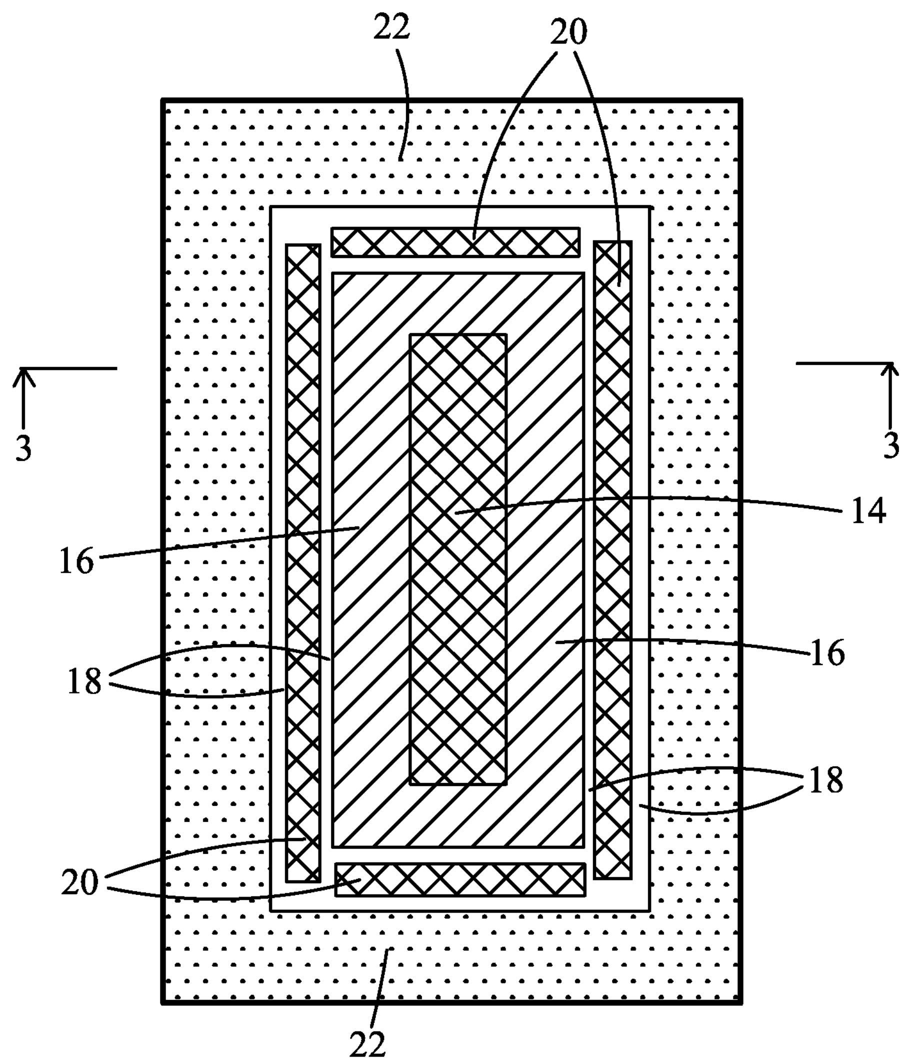
FIGS. 8 and 9 are a top view and a cross-sectional view, respectively, of a diode in accordance with various embodiments, wherein a dummy gate electrode is placed between portions of a same anode and over an n-well region, with no shallow trench isolation region directly under the dummy gate electrode.
Figure 9:
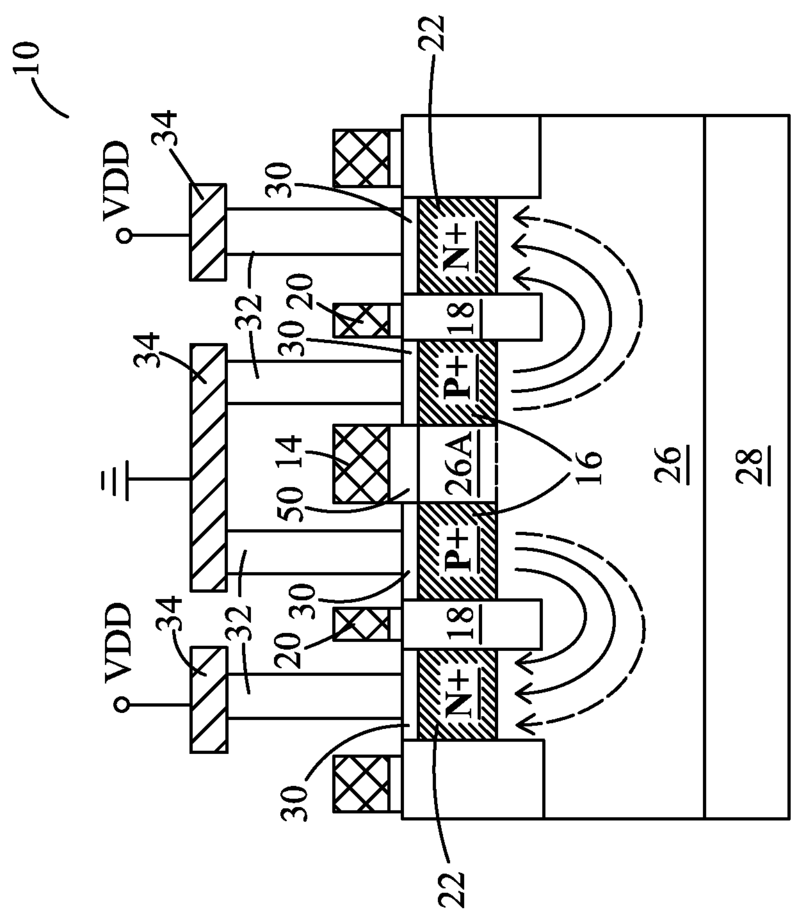

FIG. 8 illustrates a top view of a portion of diode 10 in accordance with an alternative embodiment. This embodiment is similar to the embodiment shown in FIG. 1A, except dummy gate electrode 14 is formed over well region 26, and not directly over an STI region. FIG. 9 illustrates a cross-sectional of the structure shown in FIG. 8, which shows that dummy gate electrode 14 is formed over n-well region 26, with dielectric layer 50 separating dummy gate electrode 14 from n-well region 26. Anodes 16 are formed on opposite sides of portion 26A of n-well region 26. Further, as shown in FIG. 8, anode 16 also encircles portion 26A.

Although in the exemplary embodiments, dummy gate electrodes are added in the well regions of diodes to improve pattern uniformity, the teaching of the embodiments may be applied to the formation of so-called metal-zero (M0) patterns, which are formed under the bottom metal layer (such as the metal layer in which metal lines 34 as in FIG. 3 are located), and over gate electrodes such as dummy gate electrodes 14 and 20 in FIG. 3.

In the embodiments, forming embedded dummy gate electrode 14 on STI region 12 (FIGS. 3 and 7) results in the significant improvement in the pattern density of dummy gate electrodes. When diodes 10 are used as ESD diodes, the ESD currents are schematically illustrated using arrows 40 (FIGS. 3 and 7). The ESD currents are more likely to flow in the portions of n-well region 26 (or p-well well region 126) closer to STI regions 18 (symbolized by arrows 40A) than in the portions of n-well region 26 (or p-well well region 126) farther away from STI regions 18 (symbolized by arrow 40C). As a result, from path 40A to path 40B and to path 40C, the ESD current densities reduce. Accordingly, forming STI region 12 in the center of anode 16 has a very limited adverse effect, if any, to the ESD current conducting ability of diode 10.

In accordance with embodiments, a circuit structure includes a first isolation region, and a first dummy gate electrode over and vertically overlapping the first isolation region. First pickup regions of a diode are formed on opposite sides of the first isolation region, wherein sidewalls of the first pickup regions contact opposite sidewalls of the first isolation region. Second pickup regions of the diode are formed on opposite sides of a combined region of the first pickup regions and the first isolation region, wherein the first and the second pickup regions are of opposite conductive types. A well region is under the first and the second pickup regions and the first isolation region, wherein the well region is of a same conductivity type as the second pickup regions.

In accordance with other embodiments, a circuit structure includes a well region of a first conductivity type; a first STI region extending into the well region; and a first heavily doped region over and contacting the well region. The first heavily doped region is of a second conductivity type opposite the first conductivity type. The first heavily doped region encircles and contacts the first STI region. A first dummy gate electrode is over and overlapping the first STI region. A second STI region is over the well region, wherein the second STI region encircles and contacts the first heavily doped region. A second dummy gate electrode is over and overlapping the second STI region. A second heavily doped region is over and contacting the well region, wherein the second heavily doped region is of the first conductivity type, and wherein the second heavily doped region encircles and contacts the second STI region.

In accordance with yet other embodiments, a circuit structure includes a well region of a first conductivity type; a first STI region extending into the well region; and a first dummy gate electrode over and overlapping the first STI region. A first and a second heavily doped region are over and contacting the well region, wherein the first and the second heavily doped regions are of a second conductivity type opposite the first conductivity type, and wherein the first and the second heavily doped regions are on opposite sides of, and contacting sidewalls of, the first STI region. A second STI region is over the well region, wherein the second STI region encircles and contacts the first and the second heavily doped regions, and wherein the first and the second STI regions form a continuous STI region. A second dummy gate electrode is over and overlapping the second STI region. A third heavily doped region is over and contacting the well region, wherein the third heavily doped region is of the first conductivity type, and wherein the third heavily doped region encircles and contacts the second STI region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A circuit structure comprising:

a first isolation region;

a first dummy gate electrode over and vertically overlapping the first isolation region;

first pickup regions of a diode on opposite sides of the first isolation region, wherein sidewalls of the first pickup regions contact opposite sidewalls of the first isolation region;

second pickup regions of the diode on opposite sides of a combined region of the first pickup regions and the first isolation region, wherein the first and the second pickup regions are of opposite conductive types; and a well region overlapped by the first and the second pickup regions and the first isolation region, wherein the well region is of a same conductivity type as the second pickup regions.

2. The circuit structure of claim 1, wherein the first pickup regions form a continuous pickup region encircling the first isolation region.

3. The circuit structure of claim 1, wherein the first pickup regions are discrete regions separated from each other by isolation regions.

4. The circuit structure of claim 1, wherein the second pickup regions form a continuous region encircling the first pickup regions and the first isolation region.

5. The circuit structure of claim 1 further comprising:

a second isolation region separating the first and the second pickup regions from each other; and a second dummy gate electrode directly over the second isolation region.

6. The circuit structure of claim 5, wherein the second dummy gate electrode forms a circle encircling the first dummy gate electrode.

7. The circuit structure of claim 1, wherein the first pickup regions are P+ regions, the second pickup regions are N+ regions, and the well region is an n-well region.

8. The circuit structure of claim 1, wherein the first pickup regions are N+ regions, the second pickup regions are P+ regions, and the well region is a p-well region.

9. The circuit structure of claim 1, wherein one of the first and the second pickup regions is coupled to an electrical ground, and a remaining one of the first and the second pickup regions is coupled to a positive power supply node.

10. The circuit structure of claim 1, wherein the first pickup regions and the second pickup regions comprise bottom surfaces contacting a top surface of the well region.

11. A circuit structure comprising:

a well region of a first conductivity type;

a first heavily doped region over and contacting the well region, wherein the first heavily doped region is of a second conductivity type opposite the first conductivity type;

a first dummy gate electrode over and overlapping the well region;

a first shallow trench isolation (STI) region over the well region, wherein the first STI region encircles and contacts the first heavily doped region;

a second dummy gate electrode over and overlapping the first STI region; and a second heavily doped region over and contacting the well region, wherein the second heavily doped region is of the first conductivity type, and wherein the second heavily doped region encircles and contacts the first STI region.

12. The circuit structure of claim 11 further comprising a second STI region extending into the well region, wherein the first heavily doped region encircles and contacts the first STI region.

13. The circuit structure of claim 11, wherein the first heavily doped region encircles, and contacts sidewalls of, a portion of the well region.

14. The circuit structure of claim 11, wherein the first conductivity type is n-type, and the second conductivity type is p-type.

15. The circuit structure of claim 14, wherein the first heavily doped region is coupled to an electrical ground, and the second heavily doped region is coupled to a positive power supply node.

16. The circuit structure of claim 11, wherein the first conductivity type is p-type, and the second conductivity type is n-type.

17. The circuit structure of claim 16, wherein the first heavily doped region is coupled to a positive power supply node, and the second heavily doped region is coupled to an electrical ground.

18. The circuit structure of claim 11 further comprising a plurality of dummy gate electrodes over and overlapping the first STI region, wherein the second dummy gate electrode and the plurality of dummy gate electrodes are aligned to a ring encircling the first heavily doped region.

19. A circuit structure comprising:

a well region of a first conductivity type;

a first shallow trench isolation (STI) region extending into the well region;

a first dummy gate electrode over and overlapping the first STI region;

a first and a second heavily doped region over and contacting the well region, wherein the first and the second heavily doped regions are of a second conductivity type opposite the first conductivity type, and wherein the first and the second heavily doped regions are on opposite sides of, and contacting sidewalls of, the first STI region;

a second STI region over the well region, wherein the second STI region encircles and contacts the first and the second heavily doped regions, and wherein the first and the second STI regions form a continuous STI region;

a second dummy gate electrode over and overlapping the second STI region; and a third heavily doped region over and contacting the well region, wherein the third heavily doped region is of the first conductivity type, and wherein the third heavily doped region encircles and contacts the second STI region.

20. The circuit structure of claim 19, wherein the first conductivity type is n-type, and the second conductivity type is p-type.

21. The circuit structure of claim 20, wherein the first and the second heavily doped regions are coupled to an electrical ground, and the third heavily doped region is coupled to a positive power supply node.

22. The circuit structure of claim 19, wherein the first conductivity type is p-type, and the second conductivity type is n-type.

23. The circuit structure of claim 22, wherein the first and the second heavily doped regions are coupled to a positive power supply node, and the third heavily doped region is coupled to an electrical ground.

* * * * *